United States Patent
Cai et al.

(10) Patent No.: US 8,415,186 B2
(45) Date of Patent: *Apr. 9, 2013

(54) METHOD OF SUPER FLAT CHEMICAL MECHANICAL POLISHING TECHNOLOGY AND SEMICONDUCTOR ELEMENTS PRODUCED THEREOF

(75) Inventors: Yong Cai, Nanjing (CN); Hung-Shen Chu, Hsinchu (TW)

(73) Assignee: Hong Kong Applied Science and Technology Research Institute Co. Ltd., Shatin, New Territories, Hong Kong (CN)

( * ) Notice: Subject to any disclaimer, the term of this patent is extended or adjusted under 35 U.S.C. 154(b) by 1337 days.

This patent is subject to a terminal disclaimer.

(21) Appl. No.: 11/891,466

(22) Filed: Aug. 10, 2007

(65) Prior Publication Data

US 2008/0197367 A1    Aug. 21, 2008

(30) Foreign Application Priority Data

Feb. 16, 2007   (CN) .......................... 2007 1 0080281

(51) Int. Cl.
*H01L 21/30* (2006.01)
*H01L 33/00* (2010.01)

(52) U.S. Cl.
USPC ............. 438/44; 438/455; 438/458; 438/459; 438/689; 438/691

(58) Field of Classification Search ............. 257/E21.23, 257/E21.304; 438/22, 33, 42, 43, 44, 455, 438/458, 459, 460, 462, 465, 689, 690, 691, 438/692

See application file for complete search history.

(56) References Cited

U.S. PATENT DOCUMENTS

| | | | |
|---|---|---|---|
| 5,246,884 A * | 9/1993 | Jaso et al. | 438/693 |
| 5,332,467 A | 7/1994 | Sune et al. | |
| 6,455,340 B1 | 9/2002 | Chua et al. | |
| 6,611,002 B2 * | 8/2003 | Weeks et al. | 257/94 |
| 6,776,917 B2 * | 8/2004 | Hsiao et al. | 216/88 |
| 6,887,770 B2 * | 5/2005 | Ueda et al. | 438/455 |
| 7,001,824 B2 | 2/2006 | Hon et al. | |
| 7,015,117 B2 | 3/2006 | Urbanek | |
| 7,154,123 B2 * | 12/2006 | Kunisato et al. | 257/86 |
| 2002/0195603 A1 * | 12/2002 | Arao et al. | 257/66 |
| 2006/0163592 A1 * | 7/2006 | Tsai et al. | 257/94 |

OTHER PUBLICATIONS

"Epitaxy" Retrieved Jun. 20, 2012 from http://en.wikipedia.org/wiki/Epitaxy.*
"Aluminum Oxide" Retrieved Jun. 20, 2012 from http://en.wikipedia.org/wiki/Aluminium_oxide.*
"Sapphire" Retrieved Jun. 20, 2012 from http://en.wikipedia.org/wiki/Sapphire.*
"Optical properties of diamond-like carbon and nanocrystalline diamond films" Mednikarov et. al. Journal of Optoelectronics and Advanced Materials. vol. 7, No. 3, p. 1407-1413, Jun. 2005.*

* cited by examiner

*Primary Examiner* — Cuong Q Nguyen
*Assistant Examiner* — Andrew O Arena
(74) *Attorney, Agent, or Firm* — Merchant & Gould P.C.

(57) ABSTRACT

The present invention provides a method of super flat chemical mechanical polishing (SF-CMP) technology, which is a method characterized in replacing laser lift-off in a semiconductor fabricating process. SF-CMP has a main step of planting a plurality of polishing stop points before polishing the surface, which is characterized by hardness of the polishing stop points material being larger than hardness of the surface material. Therefore, the present method can achieve super flat polishing surface without removing polishing stop points.

20 Claims, 5 Drawing Sheets

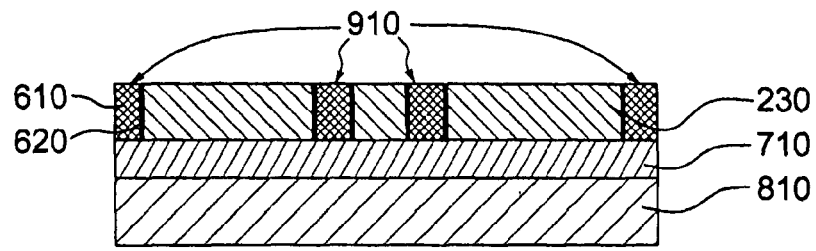
FIG. 9
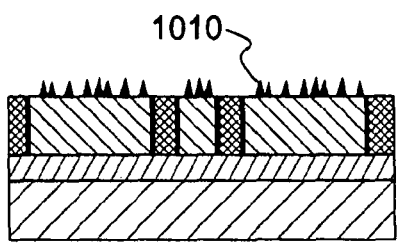 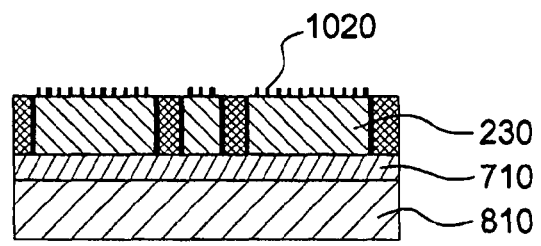
FIG. 10A    FIG. 10B
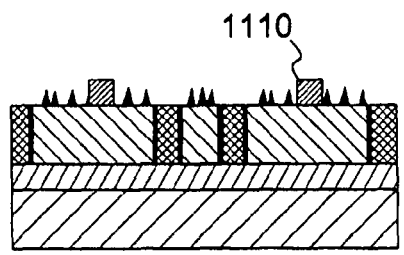 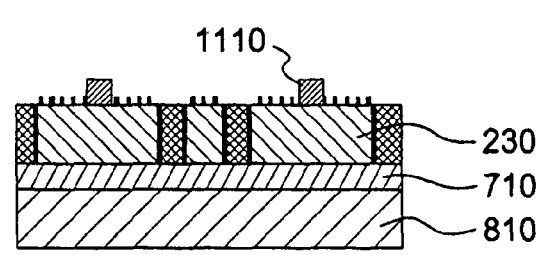
FIG. 11A    FIG. 11B

METHOD OF SUPER FLAT CHEMICAL MECHANICAL POLISHING TECHNOLOGY AND SEMICONDUCTOR ELEMENTS PRODUCED THEREOF

FIELD OF INVENTION

The present invention relates to the semiconductor field, using chemical mechanical polishing technology in the semiconductor fabricating process to produce flat surface, more specifically, a method to replace laser lift-off in a semiconductor fabricating process.

BACKGROUND

In a conventional method of producing a flip-chip light emitting diode element, depositing a plurality of epitaxy layers on a sapphire growing substrate to produce an epitaxy wafer. On the epitaxy wafer, a plurality of light emitting diode elements are produced. The epitaxy wafer is cut to produce an element die. Flip-chip connects the element die to a fixing plate. The flip-chip connecting comprises fixing the element die at the fixing plate by connecting at least one electrode of the element die to at least one pad of the fixing plate.

Now there is a film light emitting diode element to replace flip-chip light emitting diode element, and in comparison to the flip-chip light emitting diode element, film GaN light emitting diode element has advantages of a low heat resistance, uniform current in n-type layer and p-type layer, and low cost. For the film light emitting diode element, the epitaxy wafer is directly bonded to a conductive carrier substrate. Then decomposing GaN with the use of excimer laser, and by so removes sapphire substrate and keeping the active region.

The above-described method of removing sapphire substrate is called the laser lift-off, which is disclosed in U.S. Pat. Nos. 6,455,340, 7,001,824 and 7,015,117. At present, the laser lift-off is the only applied method of film GaN light emitting diode element, but the laser lift-off is incompatible with the conventional process. Therefore, the method has disadvantages of expensive equipments and laser causing processing damages.

If the laser lift-off is replaced by conventional chemical mechanical polishing (CMP) technology, in comparison to the laser lift-off the technology does not require laser equipments and the usage of laser lift-off technology. It can achieve low costs and easy application. However, when applying the conventional CMP technology, if a plane to be polished is too large, location variables of two sides and center of the plane will be too large. Therefore, the required standard of flat plane during mass production of semiconductor devices cannot be achieved, which will lower the yield of the semiconductor device production. Thus, the present invention provides a method of super flat chemical mechanical polishing technology. The method overcomes the problem of large location variables of two sides and center of the plane from the conventional CMP, and provides advantages of low costs, easy application and better yield.

SUMMARY OF INVENTION

The present invention provides a method of super flat chemical mechanical polishing (SF-CMP) technology, which is a method characterized in replacing laser lift-off in a semiconductor fabricating process. SF-CMP has a main step of planting a plurality of polishing stop points before polishing the surface, which is characterized by hardness of the polishing stop points' material being larger than hardness of the material that needs to be removed. Therefore, the present method can achieve super flat polishing surface without removing polishing stop points. The method comprises the following steps: (a) providing a first material for forming a first layer; (b) providing a second material for forming a second layer on a side of the first layer; (c) etching the second layer for producing a plurality of trenches exposing surface of the first layer; (d) filling a third material, which has hardness larger than the first material and the second material, in the trenches to form a plurality of polishing stop points; (e) removing the third material outside the trenches, and exposing surface of the second layer; (f) bonding surface of the second layer on a conductive fourth material; and (g) polishing the first material to expose the second layer material by mechanical or chemical mechanical polishing method. Wherein the etching step is Inductively Coupled Plasma, the third material is diamond film or Diamond Like Carbon film, and removing is by mechanical or chemical mechanical polishing.

The present invention also provides a method of producing film light emitting diode element, the method comprising the following steps: (a) providing a first material for forming a first layer; (b) providing a second material of a semiconductor material, for forming a second layer acting as an active region on a side of the first layer; (c) etching the second layer for producing a plurality of trenches exposing surfaces of the first layer; (d) covering a layer medium; (e) filling a third material, which has hardness larger than the first material and the second material, in the trenches to form a plurality of polishing stop points; (f) providing a fourth material for forming a first electrode layer on surfaces of the second layer; (g) bonding the first electrode layer on a conductive carrier; (h) removing the first layer; and (i) forming a plurality of second electrodes on surfaces of the second material after removing the first layer. Wherein the first material is a sapphire; the second material is semiconductor material of Group III-V or Group II-VI; third material is diamond film, Diamond Like Carbon (DLC) film; the etching in Step (c) is Inductively Coupled Plasma etching; the removing in Step (h) is by mechanical or chemical mechanical polishing; the first electrode layer is p-type; and the second electrode layer is n-type. The above method further comprises a step of performing surface roughening on a polished surface or a step of forming two-dimensional photonic crystals after polishing.

Since an embodiment of the present invention is planting diamond material in active regions of light emitting diodes to form a plurality of polishing stop points. Therefore the present invention calls it a diamond shoulder light emitting diode structure.

An embodiment of the present invention specifies in removing substrate of film device. An advantage of using diamond films in light emitting devices is better thermal dissipation. In addition, in another embodiment of the present invention, planting diamond film surrounding the active region can prevent active region from being removed in the step of removing top layer material or bottom layer material of active region. More specifically, in an embodiment of a film light emitting diode element producing, all semiconductor fabrication steps are related to film light emitting diode element, and polishing stop points are a key method for protecting the active region during mechanical or chemical-mechanical removing sapphire layer.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 9 describes a cross-sectional view of an initial sample after mechanical or chemical mechanical polishing according to one embodiment of the present invention.

FIG. 10A describes a cross-sectional view of an initial sample after roughening active region surface according to one embodiment of the present invention.

FIG. 10B describes a cross-sectional view of an initial sample after forming two-dimensional photonic crystal on active region surfaces according to one embodiment of the present invention.

FIG. 11A describes a cross-sectional view of forming second electrode in FIG. 10A according to one embodiment of the present invention.

FIG. 11B describes a cross-sectional view of forming second electrode in FIG. 10B according to one embodiment of the present invention.

DETAILED DESCRIPTION OF THE INVENTION

Figure 1:
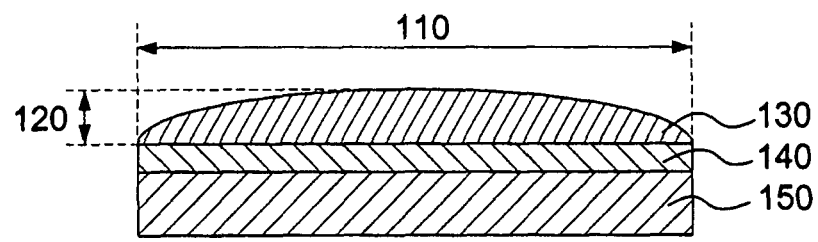
FIG. 1 describes conventional chemical mechanical polishing technology.

FIG. 1 presents a conventional semiconductor structure, which comprises active region 130, electrode layer 140 and carrier 150. When applying conventional chemical mechanical polishing technology, if a plane to be polished is too large, location variables of two sides and center of the plane will be too large. Therefore, a distance between L the two sides of the plane is proportional to the variable V.

Figure 2:
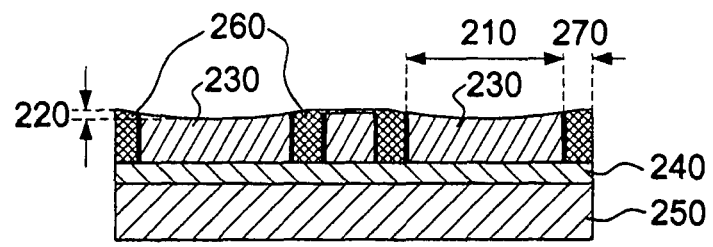
FIG. 2 describes a plane after applying super flat chemical mechanical polishing technology.

FIG. 2 shows a semiconductor structure having stop point 260, the semiconductor structure comprises a distance L210 between two sides of a plane to be polished, variable V220, active region 230, electrode layer 240, carrier 250 and stop point width a270. Also in the present invention, after applying an embodiment of the super flat chemical mechanical polishing technology, when after planting a plurality of polishing stop points 260, variable V of the entire plane can be controlled within standards required in semiconductor fabricating process. The method comprises the following steps: (a) providing a first material for forming a first layer; (b) providing a second material for forming a second layer on a side of the first layer; (c) etching the second layer for producing a plurality of trenches exposing surface of the first layer; (d) filling a third material, which has hardness larger than the first material and the second material, in the trenches to form a plurality of polishing stop points; (e) removing the third material outside the trenches, and exposing surface of the second layer. Furthermore, the present embodiment still can be like the step of removing the first material and control the variable V to be within standards required in semiconductor fabricating process.

Figure 3:
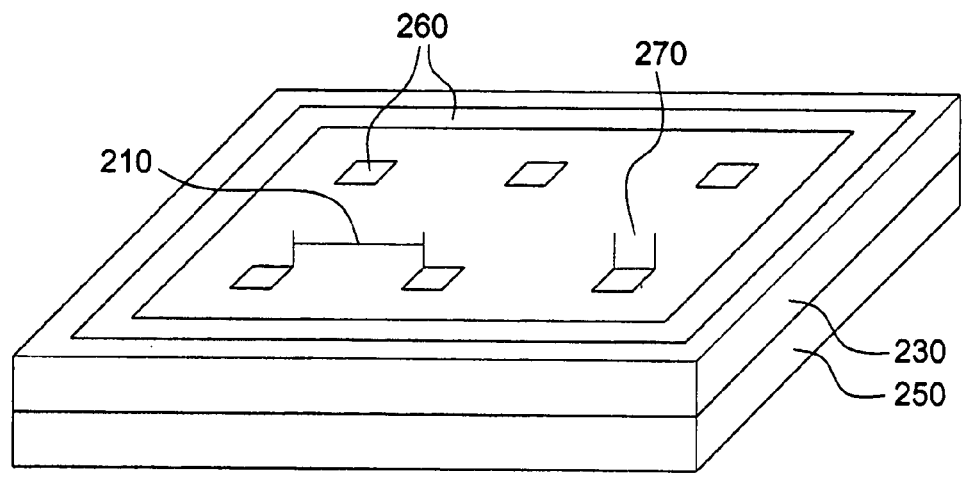
FIG. 3 describes a tilted top view of stop point distribution according to one embodiment of the present invention.

FIG. 3 presents a cross-sectional view of stop point distribution according to one embodiment the present invention. As described above, a distance between the two sides of the plane is proportional to the variable. Therefore, a variable within the standard range can be obtained by controlling sizes of the stop points and distances between the stop points. Evidently, the stop points in the present embodiment can be circles, triangles, rectangles or of other geometrical shapes.

Figure 4:
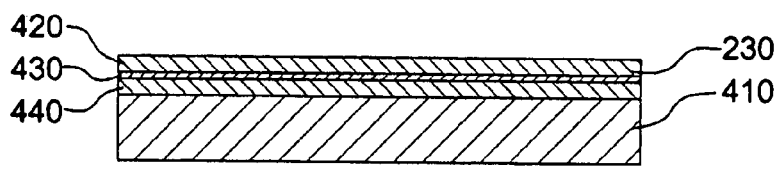
FIG. 4 describes a cross-sectional view of an initial sample according to one embodiment of the present invention.
Figure 5:
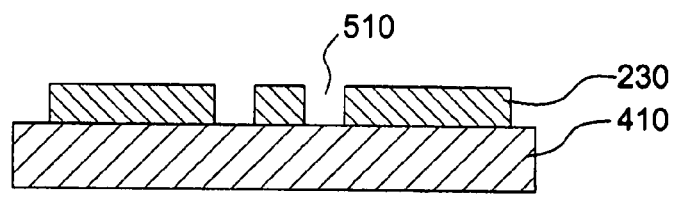
FIG. 5 describes a cross-sectional view of an initial sample after etching according to one embodiment of the present invention.
Figure 6:
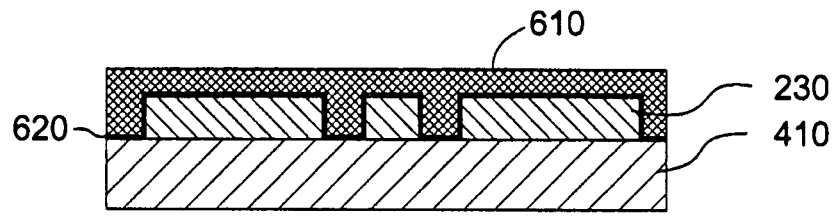
FIG. 6 describes a cross-sectional view of an initial sample after covering diamond film according to one embodiment of the present invention.
Figure 7:
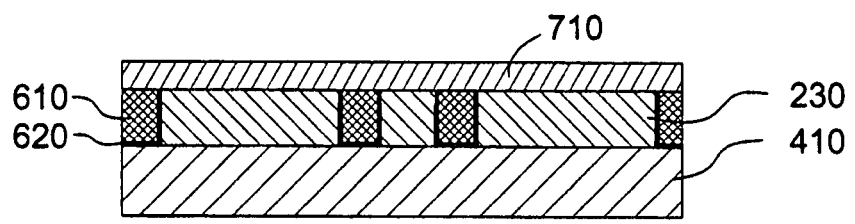
FIG. 7 describes a cross-sectional view of an initial sample after forming first electrode layer according to one embodiment of the present invention.
Figure 8:
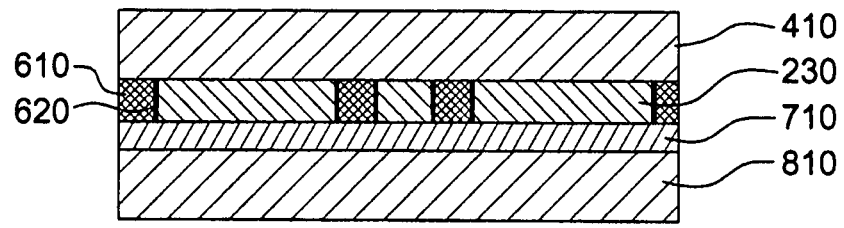
FIG. 8 describes a cross-sectional view of an initial sample after bonding conductive carrier according to one embodiment of the present invention.
Figures 12A, 12B:
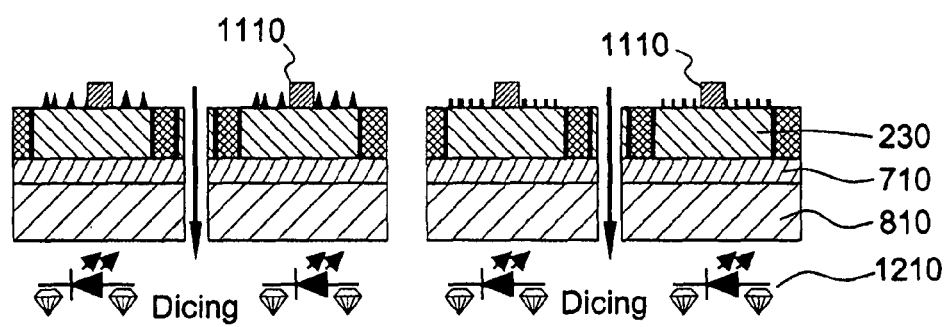
FIG. 12A describes a cross-sectional view of cutting light emitting device of FIG. 11A according to one embodiment of the present invention.
FIG. 12B describes a cross-sectional view of cutting light emitting device of FIG. 11B according to one embodiment of the present invention.

According to an application of the present invention, another embodiment is disclosed in FIG. 4-FIG. 12, which is a method of fabricating a film semiconductor light emitting device. The method comprise the following steps: (a) providing a first material for forming a first layer 410; (b) providing a second material of a semiconductor material, for forming a second layer 230 acting as an active region on a side of the first layer (as shown in FIG. 4); (c) etching the second layer for producing a plurality of trenches 510 exposing surfaces of the first layer (as shown in FIG. 5); (d) covering a layer medium 620; (e) filling a third material 610, which has hardness larger than the first material and the second material, in the trenches to form a plurality of polishing stop points (as shown in FIG. 6); (f) removing the third material 610 and medium material 620 outside the trenches and providing a fourth material for forming a first electrode layer 710 on surfaces of the second layer (as shown in FIG. 7); (g) bonding the first electrode layer on a conductive carrier 810 (as shown in FIG. 8); (h) removing the first layer exposing a plurality of polishing stop points 910 (as shown in FIG. 9); and (i) forming a plurality of second electrodes 1110 on surfaces of the second material after removing the first layer (as shown in FIG. 11). The present embodiment further comprises roughening active region surfaces 1010 as in FIG. 10A or forming two-dimensional photonic crystal 1020 on active region surfaces as in FIG. 10B. Finally, like shown in FIG. 12A or 12B, cutting the light emitting device. In the embodiment described above, the first material can be sapphire; the second material can be GaN or GaInN, the second material semiconductor material of Group III-V or Group II-VI; the etching in Step (c) is Inductively Coupled Plasma etching; wherein the third material can be diamond film or Diamond Like Carbon (DLC) film; the removing in Step (h) is by mechanical or chemical mechanical polishing; the first electrode layer is p-type and the second electrode layer is n-type. An embodiment of the present invention is a diamond shoulder light emitting diode referred as 1210.

The semiconductor device structure produced according to one embodiment of the present invention, comprise: a conductive carrier; a semiconductor material layer; a superhard material, wherein the superhard material has at least a surface adjacent to the semiconductor material layer; a first electrode layer located on a surface of the semiconductor material layer; and a second electrode layer located on another surface of the semiconductor material layer opposing the first electrode layer. Wherein the semiconductor material layer comprises InGaP, AlInGaN, AlInGaP, AlGaAs, GaAsP or InGaAsP; the superhard material comprises diamond, Diamond Like Carbon (DLC), Titanium Nitride (TiNx) or Titanium Tungsten (TiWx) alloy; and the conductive carrier comprises copper, silicon, silicon carbide or GaAs.

The invention claimed is:

1. A method of fabricating a super flat plane in semiconductor fabricating, the method comprising the following steps:
   (a) providing a first material for forming a first layer;
   (b) providing a second material for forming a second layer on a side of the first layer;
   (c) etching the second layer for producing a plurality of trenches exposing surfaces of the first layer;
   (d) filling a third material, which has hardness larger than the first material and the second material, into the trenches to form a plurality of polishing stop points having a surface above the surface of the second layer;
   (e) removing the third material exceeding the trenches and exposing a surface of the second layer;
   (f) bonding the surface of the second layer onto a conductive fourth material; and
   (g) polishing the first material to expose the second layer material by mechanical or chemical mechanical polishing method.

2. The method according to claim 1, wherein the etching in Step (c) is Inductively Coupled Plasma etching.

3. The method according to claim 1, wherein the third material is diamond film, Diamond Like Carbon (DLC) film, Titanium Nitride (TiNx) or Titanium Tungsten (TiWx) alloy.

4. The method according to claim 1, wherein the removing in Step (e) is using plasma etching with oxygen ambient.

5. A method of fabricating a semiconductor light emitting device, the method comprising the following steps:
   (a) providing a first material for forming a first layer;
   (b) providing a second material for forming a second layer acting as an active region on a side of the first layer;
   (c) etching the second layer for producing a plurality of trenches exposing surfaces of the first layer;
   (d) covering a layer medium on the second layer;
   (e) filling a third material, which has hardness larger than the first material and the second material, into the trenches to form a plurality of polishing stop points having a surface above the surface of the second layer;
   (f) removing the third material exceeding the trenches and providing a fourth material for forming a first electrode layer on surfaces of the second layer;
   (g) bonding the first electrode layer on a conductive carrier;
   (h) removing the first layer by mechanical or chemical mechanical polishing; and
   (i) forming a plurality of second electrodes on surfaces of the second material after removing the first layer.

6. The method according to claim 5, wherein the first material is a sapphire, silicon, AlN, SiC, GaAs or GaP.

7. The method according to claim 5, wherein the second material is a gallium nitride (GaN), ZnO, InGaP, AlInGaN, AlInGaP, AlGaAs, GaAsP or InGaAsP, or a multi-layer structure structured with the above materials.

8. The method according to claim 5, wherein the third material is diamond film, Diamond Like Carbon (DLC) film, Titanium Nitride (TiNx) or Titanium Tungsten (TiWx) alloy, or other superhard material with hardness is larger than hardness of the first material.

9. The method according to claim 5, wherein the fourth material is a metal or a multi-layer of metals.

10. The method according to claim 5, further comprising a step of performing surface roughening on a polished surface or a step of forming two-dimensional photonic crystals after polishing.

11. The method according to claim 5, wherein the etching in Step (c) is Inductively Coupled Plasma etching.

12. The method according to claim 5, wherein the first electrode layer is p-type.

13. The method according to claim 5, wherein the second electrode is n-type.

14. The method according to claim 7, wherein the second material is a semiconductor light emitting multi-layer structure.

15. A method of fabricating a semiconductor light emitting device, the method comprising the following steps:
   (a) providing a substrate with an epitaxy layer formed thereon, wherein the epitaxy layer has trenches disposed therein;
   (b) covering a layer medium on the epitaxy layer;
   (c) forming polishing stop points in the trenches with a material having hardness larger than the epitaxy layer, wherein the polishing stop points have a surface above the surface of the epitaxy layer;
   (d) removing the material exceeding the trenches and exposing a surface of the epitaxy layer;
   (e) forming a first electrode layer on the epitaxy layer;
   (f) bonding a conductive carrier layer on the first electrode layer;
   (g) removing the substrate from the epitaxy layer by mechanical or chemical mechanical polishing;
   (h) forming a plurality of second electrodes on exposed surfaces of the epitaxy layer; and
   (i) cutting the formed structures.

16. The method according to claim 15, wherein Step (a) comprises the following steps:
   (a1) providing a substrate;
   (a2) forming an epitaxy layer on the substrate; and
   (a3) etching the epitaxy layer to produce a plurality of trenches exposing surfaces of the substrate.

17. The method according to claim 16, wherein the etching in Step (a3) is Inductively Coupled Plasma etching.

18. The method according to claim 15, wherein the material having hardness larger than the epitaxy layer is diamond film, Diamond Like Carbon (DLC) film, Titanium Nitride (TiNx) or Titanium Tungsten (TiWx) alloy.

19. The method according to claim 15, wherein the first electrode layer is p-type.

20. The method according to claim 15, wherein the second electrode is n-type.

* * * * *